United States Patent [19] [11] 4,375,038
Crosby [45] Feb. 22, 1983

[54] RMS CONVERTER
[75] Inventor: John B. Crosby, Yorba Linda, Calif.
[73] Assignee: Beckman Instruments, Inc., Fullerton, Calif.
[21] Appl. No.: 65,691
[22] Filed: Aug. 10, 1979
[51] Int. Cl.³ .............. G06G 7/163; H03K 17/74; G06G 7/24
[52] U.S. Cl. .................. 307/492; 307/500; 307/503; 328/144; 328/145
[58] Field of Search .............. 328/144, 145; 307/230, 307/229, 492, 501, 503; 364/811, 814, 857; 324/132

[56] References Cited
U.S. PATENT DOCUMENTS

| | | | |
|---|---|---|---|
| 3,423,578 | 1/1969 | Platzer, Jr. et al. | 328/145 |
| 3,657,528 | 4/1972 | Plante | 328/145 |
| 3,743,949 | 7/1973 | Engel et al. | 328/144 |
| 3,795,868 | 3/1974 | Ohme et al. | 328/144 |
| 3,840,813 | 10/1974 | Allen et al. | 328/144 |
| 4,100,433 | 7/1978 | Duffy et al. | 307/230 |
| 4,109,165 | 8/1978 | Katakuran et al. | 328/145 |

Primary Examiner—Stanley D. Miller
Assistant Examiner—B. P. Davis
Attorney, Agent, or Firm—R. J. Steinmeyer; F. L. Mehlhoff

[57] ABSTRACT

A circuit for measuring the root-mean-square (RMS) value of an electrical signal. The output may be linear or logarithmic. The circuit uses devices with logarithmic voltage/current characteristics (usually transistors), and allows the logarithmic devices to be connected directly together without intervening operational amplifiers. In its simplest form, the invention consists of a rectifier circuit, four transistors and a capacitor.

13 Claims, 8 Drawing Figures

RMS CONVERTER

BACKGROUND OF THE INVENTION

This invention relates to electrical circuits which measure the root-mean-square (RMS) value of electrical signals.

The RMS value of an electrical signal is an important signal parameter because it represents the signal's power.

One type of apparatus for measuring a signal's RMS value which is well known in the prior art measures the heat dissipated by the signal in a resistive load, using some sort of temperature transducer. However, such apparatus have the disadvantages of long settling time for the measurements and limited dynamic range.

The most common type of prior art apparatus for measuring RMS values uses electrical circuits to perform a sequence of operations on the signal which is equivalent to the mathematical expression defining the RMS value. For example, the mathematical definition of RMS requires squaring the instantaneous value of a signal, then averaging this over time, then taking the square root of this average value.

In the prior art, the practically universal means for performing the squaring and square-rooting operations is by using the logarithmic voltage-current characteristic of semiconductor diodes and transistors. This technique relies on the principle that the product of two numbers may be obtained by computing the logarithm of each of the two numbers, summing the two results, and then taking the anti-logarithm of the sum. This technique is popular because logarithmic amplifiers and summers are much easier to design than multipliers.

The most common type of prior art RMS measuring circuit includes three separate sub-circuits in cascade which perform the squaring, averaging and square-rooting operations, respectively. One disadvantage of such circuits is that their means for summing the logarithms of signals depends on precision trimming of resistors or matching of logarithmic elements. For example, a prior art RMS circuit may include a sub-circuit for squaring a quantity; i.e., for raising that quantity to a power of two. However, unless certain critical components are precisely matched or trimmed, the sub-circuit's output will actually equal the quantity raised to a power not quite equal to two. The resulting errors, because of their nonlinearity, are almost impossible to correct.

Another disadvantage of such prior art circuits is their complexity; i.e., their large number of components. One obvious consequence of using a large number of components is high cost. Another is that, when fabricated on an integrated circuit chip, the circuit occupies a large area on the chip, thereby decreasing the yield of the fabrication process or preventing the inclusion of additional circuits on the chip to perform related functions. A further disadvantage of using a large number of components is that this usually restricts the frequency response of the circuit.

An RMS measuring circuit that overcomes most of the disadvantages of the foregoing type of circuit is disclosed in U.S. Pat. No. 3,743,949 to Engel et al. The disclosed circuit uses a combination of four bipolar transistors and a capacitor in place of the aforementioned separate sub-circuits for squaring, averaging and square-rooting. The disclosed circuit requires no calibration adjustments to minimize nonlinearities. It also has the advantage of requiring far fewer components than the previously described type of circuit.

Although it has the important advantages just described, the RMS measuring circuit disclosed by Engel et al. has various inherent shortcomings. One shortcoming is that the RMS measurement suffers nonlinear errors because a time-varying proportion of the input is diverted from the logarithm-computing transistors to the base of one of the antilog-computing transistors. Another shortcoming is that the disclosed means for maintaining a substantially constant voltage across the antilog-computing part of the circuit comprises a zener diode which undesirably increases the current drain from the power supply. Such current drain can significantly reduce battery life in a battery-powered portable instrument. A further shortcoming of the circuit disclosed by Engel is that the high frequency response is limited by the interelectrode capacitance of the transistors.

Another shortcoming is that the disclosed circuit does not provide measurement results in logarithmic units. Logarithmic RMS measurements, typically in units of "decibels," are commonly preferred by engineers in the communications and acoustics fields. A further shortcoming of the disclosed circuit is that the output signal it provides has an alternating component that must be filtered out to obtain the desired RMS measurement result.

Various embodiments of the pesent invention overcome one or more of the above disadvantages.

SUMMARY OF THE INVENTION

The present invention is an improved RMS measuring circuit having one or more of the following features.

One feature is that the RMS measuring circuit provides an output signal not requiring any additional filtering or averaging and not requiring the use of an additional capacitor in the RMS circuit.

Another feature is that the RMS circuit provides a logarithmic output signal.

Another feature is that the RMS circuit includes an additional transistor for reducing errors caused by the diversion of input current from the logarithm-computing transistors to the antilog-computing transistors.

DESCRIPTION OF PREFERRED EMBODIMENTS

The present invention comprises various improvements over a basic RMS measuring circuit disclosed in U.S. Pat. No. 3,743,949 to Engel et al. Since understanding the basic circuit is helpful in understanding the present invention, the basic circuit will be described first.

Figure 1:
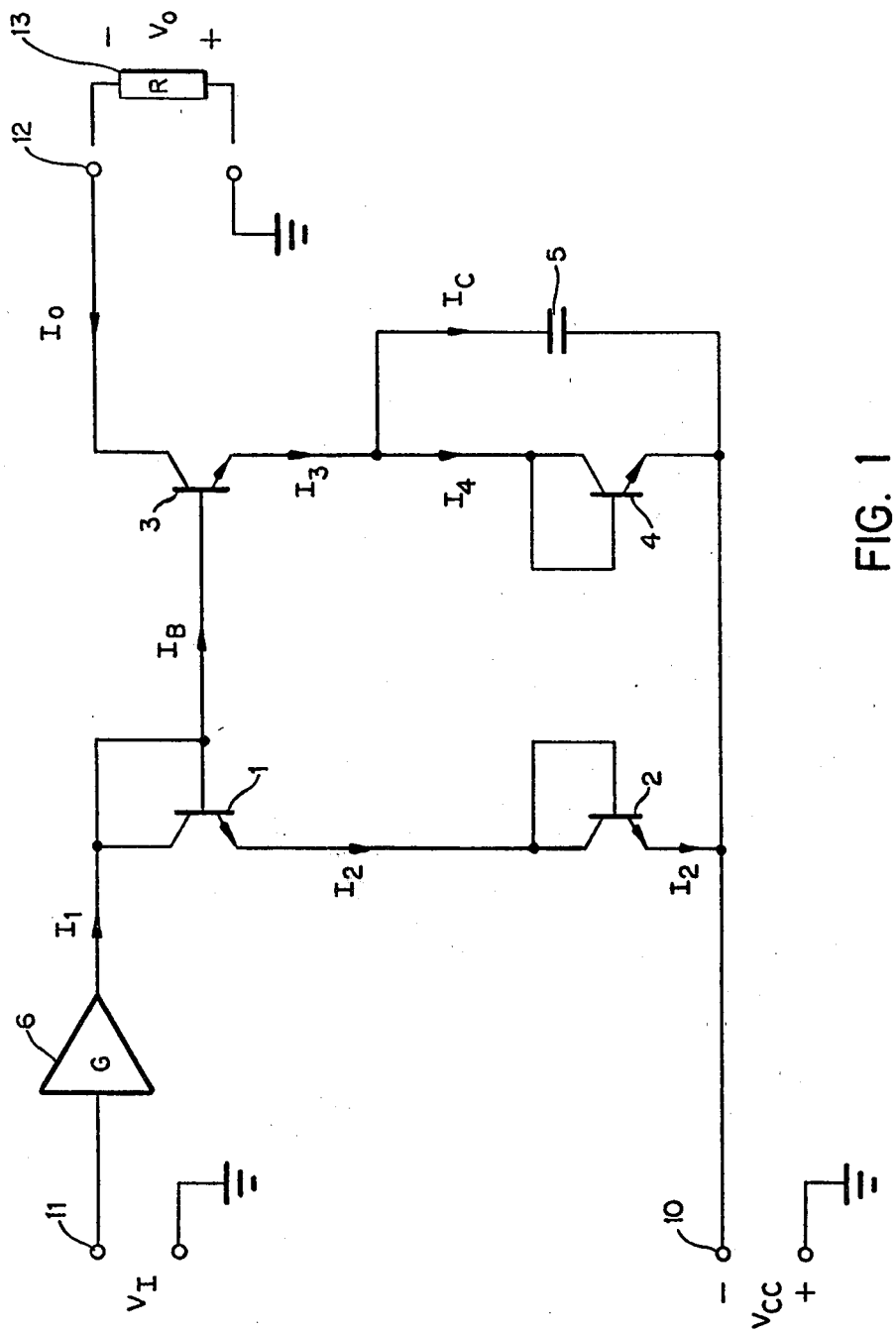
FIG. 1 is a schematic diagram of a basic RMS measuring circuit similar to a prior art design.

FIG. 1 is a schematic diagram of a basic RMS measuring circuit similar to that disclosed in the Engel et al. patent. In this embodiment, the average value of the output signal is proportional to the RMS value of the input signal.

In this embodiment, the input signal whose RMS value is to be measured is a voltage $V_I$ connected between node 11 and ground. Rectifying means 6, connected to node 11, produces a current $I_1$ proportional to the absolute value of the input voltage $V_I$. In other words, $I_1 = G|V_I|$, where G is a gain constant determined by the rectifying means 6.

In the circuit disclosed by Engel et al., rectifying means 6 is simply a conventional full wave bridge rectifier circuit. Such a rectifying means is especially suitable when the input signal is a current instead of a voltage. In the latter case, the preferred embodiment of rectifying means 6 is described in U.S. Pat. No. 3,840,813. It is the portion of the circuit illustrated in FIG. 2 thereof which consists of the components labeled 8 through 13 and 21.

The current $I_1$ divides into two current paths, one path through bipolar transistors 1 and 2, and another path into the base of bipolar transistor 3. If transistor 3 has a large current gain, its base current will be much less than the current $I_2$ through transistors 1 and 2. Therefore, $I_2$ approximately equals $I_1$.

As is characteristic of all bipolar transistors, transistors 1 and 2 each have an emitter-base voltage equal to the logarithm of a quantity proportional to the emitter current $I_2$. Because transistors 1 and 2 are connected in series, the total voltage drop across them equals two times the logarithm of a quantity proportional to the emitter current $I_2$.

This total voltage is applied across the emitter-base junctions of bipolar transistors 3 and 4 connected in series, so that the total voltage is divided between these two transistors. The voltage drop across each transistor's emitter-base junction interrelates with that transistor's emitter current. Specifically, the emitter currents $I_3$ and $I_4$ of transistors 3 and 4, respectively, are proportional to the anti-logarithm of the emitter-base voltages of transistors 3 and 4, respectively.

Capacitor 5 affects the way the total voltage is divided between transistors 3 and 4, and thus affects their emitter currents, by bypassing the AC component of $I_3$ so that $I_4$ equals the time average of $I_3$. The significance of this will be explained in the subsequent detailed discussion of the circuit's theory of operation.

The output signal is current $I_0$ which flows through output node 12. This output current is taken from the collector of transistor 3 and almost exactly equals that transistor's emitter current $I_3$.

This output current $I_0$ may be converted to an output voltage $V_0$ by connecting a resistor 13 between output node 12 and ground.

To complete the above paths of current flow, a path of current flow must be provided between node 10 and ground. In the preferred embodiment, this is done by connecting between node 10 and ground a negative voltage source $V_{cc}$.

To demonstrate how this circuit computes the RMS value of the input voltage $V_I$, it is necessary to describe the circuit's operation in mathematical terms.

In this discussion, voltage $V_I$ and currents $I_1$ through $I_4$ shall be defined as they were defined above. In addition, $V_1$ through $V_4$ shall be defined as the respective base-emitter voltages of the four transistors.

It is well known in the art that the emitter current I and base-emitter voltage V in a bipolar transistor are related as follows:

$$I = I_s[\exp(Vq/kT) - 1] \quad (1)$$

where
 $I_s$ = the transistor's emitter-junction saturation current with the collector shorted to the base,
 q = the charge of an electron,
 k = Boltzmann's constant,
 T = the transistor's absolute temperature.

To obtain the desired logarithmic relationship between V and I, it is necessary that the exponential term in equation (1) be much greater than the "minus one" term, so the latter term may be omitted. This will occur if V is at least a few times greater than (kT/q), the latter being only 25 mv at room temperature. This is equivalent to requiring that $I \gg I_s$. This requirement may be satisfied by selecting the gain constant G of the rectifying means 6. This simplifies eqn. (1) to $$I = I_s \exp[V(q/kT)] \quad (2a)$$

Taking the logarithm of both sides $$V = (kT/q)\ln(I/I_s) \quad (2b)$$

Eqn. (2b) now will be applied to the circuit of FIG. 1. First, use Kirchoff's voltage law that the sum of the voltages around a closed loop equals zero.

$$0 = V_1 + V_2 - V_3 - V_4 \quad (3)$$

Now substitute eqn. (2b) into eqn. (3), remembering that $I_2$ is the emitter current of both transistors 1 and 2.

$$0 = (k/q)[T_1 \ln(I_2/I_{s1}) + T_2 \ln(I_2/I_{s2}) - T_3 \ln(I_3/I_{s3}) - T_4 \ln(I_4/I_{s4})]$$

Multiplying both sides by (q/k), and then exponentiating both sides:

$$1 = (I_2/I_{s1})T_1(I_2/I_{s2})T_2(I_{s3}/I_3)T_3(I_{s4}/I_4)T_4 \quad (4)$$

If all four transistors are at the same temperature T, this simplifies to $$(I_2)^2 = rI_3I_4 \quad (5a)$$

where r is the constant $$(I_{s1}I_{s2})/(I_{s3}I_{s4}) \quad (5b)$$

Eqns. (4) and (5) demonstrate that maintaining all four transistors at the same temperature is critical to the accuracy of the squaring and square-rooting operations of the circuit. For example, if the four temperatures are unequal, $I_2$ may be raised to some power other than 2.

The simplest and best way to ensure this is to fabricate all four transistors in a single package, preferably on a single monolithic integrated circuit.

One advantage of this circuit is that it has no factors other than temperature which affect the accuracy of the squaring characteristic shown in eqn. (5a).

The circuit preferably has no discrete resistors whatsoever in the squaring and square-rooting circuit, and any mismatching among transistors merely changes the linear scale factor r in eqn. (5), which can easily be compensated for by a simple gain adjustment.

An important key to the operation of the circuit is the way capacitor 5 interrelates $I_3$ and $I_4$. As will be seen, capacitor 5 contributes to each of the three steps of the RMS operation—squaring, averaging, and square-rooting.

First, apply Kirchoff's current law to the node to which capacitor 5 and transistors 3 and 4 are all connected, and then take the time average of both sides of the equation. Letting $I_c$ denote the current through capacitor 5, and letting an overbar denote the time average of a signal, we have:

$$I_3 = I_4 + I_c$$

$$\overline{I_3} = \overline{I_4} + \overline{I_c} \tag{6}$$

The voltage across capacitor 5 is proportional to the integral over all time of the current through the capacitor. Hence, the time average value of the current $I_c$ through the capacitor in response to a steady-state input signal must, after some initial transients, become zero; otherwise, the capacitor's voltage would approach infinity. Therefore, $I_c = 0$. This simplifies eqn. (6) to:

$$\overline{I_3} = \overline{I_4} \tag{7}$$

If capacitor 5 is large enough, it will bypass almost all of the AC components of the current $I_3$, leaving $I_4$ an essentially constant DC value. Equivalently, if capacitor 5 is large enough, the AC component of voltage $V_4$ will be negligible compared to the DC component. Since $V_4$ is essentially constant, $I_4$ must also be essentially constant.

Since $I_4$ is essentially constant, its value at all times equals its average value; i.e., $$I_4 = \overline{I_4}$$

Combining this with eqn. (7):

$$I_4 = \overline{I_4} = \overline{I_3} \tag{8}$$

Averaging both sides of eqn. (6a), and then applying eqn. (8):

$$\overline{(I_2)^2} = \overline{r I_3 I_4}$$

$$= r I_4 \overline{I_3} \text{ because } r, I_4 \text{ are constants}$$

$$= r (I_4)^2 \text{ from eqn. (8)}$$

Taking the square root of both sides:

$$I_4 = \sqrt{r} \cdot \sqrt{\overline{(I_2)^2}} \tag{9}$$

$$= \sqrt{r} \cdot RMS(I_2)$$

where $RMS(I_2)$ denotes the RMS value of $I_2$.

The final step is to relate $I_2$ and $I_4$ to the input and output signals $V_I$ and $I_0$, respectively.

The output current $I_0$ is the collector current of transistor 3, which substantially equals transistor 3's emitter current $I_3$ if transistor 3 has a large current gain. In other words, $$I_0 = I_3 \tag{10}$$

Substituting eqn. (10) into eqn. (8):

$$I_4 = \overline{I_3} = \overline{I_0} \tag{11}$$

The operation of the input circuit relies on two assumptions. The first is that transistor 3 has a large current gain so that its base current $I_B$ is negligible relative to its emitter current $I_3$. The second is that $I_2$ and $I_3$ are on the same order of magnitude, so that $I_B$ is also negligible relative to $I_2$. Since $I_1 = I_2 + I_B$, this means that $I_1 = I_2$. As stated earlier, $I_1 = G V_I$. Therefore:

$$I_2 = I_1 = G V_1 \tag{12}$$

Substituting eqns. (11) and (12) into eqn. (9):

$$\overline{I_0} = \sqrt{r} \, RMS(G V_I) \tag{13}$$

$$= G \sqrt{r} \, RMS(V_I)$$

Equation (13) expresses the desired result that the average value of the output current $I_0$ is proportional to the RMS value of the input voltage $V_I$.

If one wishes to obtain an output voltage $V_0$ instead of an output current, it suffices to connect a resistor 13 of value R between output node 12 and ground, so that $V_0 = I_0 R$, and $$\overline{V_0} = RG \sqrt{r} \, RMS(V_I) \tag{14}$$

Eqns. (13) and (14) indicate that the output signal $I_0$ or $V_0$ must be averaged in order to obtain the desired RMS value. In practice, this is no problem because the output signal is usually connected to a display device which inherently responds to the average value of the signal. The most commonly used display device, a D'Arsonval meter, has this averaging characteristic.

The other commonly used display device is a digital display driven by an analog-to-digital (A/D) converter. The type of A/D converter most commonly used in manually operated measuring instruments is the dual-slope integrating type. This type of A/D inherently has the required characteristic of responding to the average value of the signal.

If the output signal is applied to a device which does not have the required averaging characteristic, the average value of the output signal may be obtained by applying it to an integrator or a low-pass filter, such as a capacitor, as would be obvious to one skilled in the art.

One advantage of the circuit is its freedom from component matching requirements. According to eqn. (5), the degree to which transistors 1 through 4 are mismatched only affects the value of r, which, according to eqns. (13) and (14), merely changes the linear scale factor of the output signal $I_o$ or $V_o$. If r is unknown or inconsistent, the circuit can be calibrated easily by adding a gain adjustment to the input or output, or by adjusting G or R.

On the other hand, if one prefers to eliminate the need for individual calibration, this may be accomplished by closely matching the emitter junction saturation currents $I_s$ of transistors 1 through 4. Very close matching is feasible if all four transistors are fabricated on a single monolithic integrated circuit. According to eqn. (5b), this would ensure that $r=1$, thereby eliminating r from eqns. (13) and (14). This would leave the linear scale factor dependent only on G and R, which may be determined by precision resistors, hence eliminating the need for individual calibration.

Figure 2:
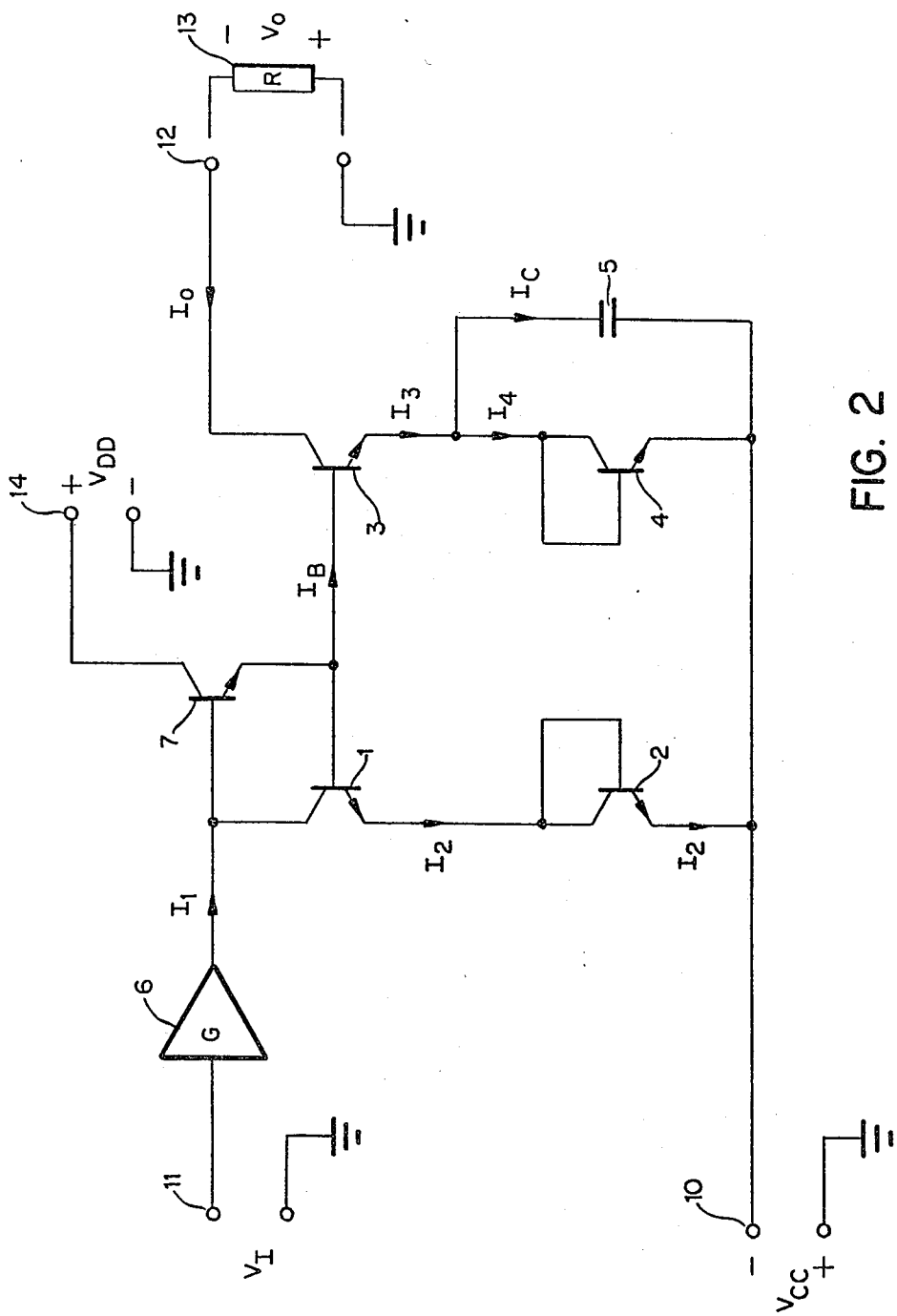
FIG. 2 is a schematic diagram of an improved RMS circuit comprising an additional transistor 7.

One feature of the present invention is a refinement which improves the accuracy of the basic RMS measuring circuit. As illustrated in FIG. 2, the refinement consists of transistor 7 and terminal 14, to which a positive voltage source $V_{DD}$ may be connected. According to the discussion preceding eqn. (12), the accuracy of the RMS circuit is reduced to the extent $I_2$ is less than $I_1$ because part of $I_1$ supplies the base current $I_B$ of transistor 3. To the extent this occurs, the resulting errors in $I_2$ will be nonlinear because $I_B$ is not linearly proportional to $I_1$, which makes the problem more serious than if $I_2$ differed from $I_1$ by only a proportionality constant. Although $I_B$ is insignificant if transistor 3 has a very large current gain, if a transistor 7 is added as shown in FIG. 2, the effect of $I_B$ on $I_2$ is further divided by the current gain of transistor 7.

It is obvious to one skilled in the art that, in any of the circuits discussed, all NPN transistors can be replaced with PNP transistors and all voltage and current polarities reversed.

It also is obvious that any of the transistors whose base and collector are connected together, such a transistor being referred to in the art as a diode-connected transistor, can be replaced with a semiconductor diode. For example, FIG. 3 illustrates a modification of the circuit of FIG. 1 in which transistors 1, 2 and 4 are replaced by semiconductor diodes 1a, 2a and 4a.

In some applications it is useful for an output signal to be a logarithmic, instead of linearly proportional, function of the RMS value of the input signal. According to the present invention, this may be accomplished by modifying any of the circuits shown in FIGS. 1, 2 and 3 to provide a logarithmic output signal equal to the voltage across capacitor 5. This merely requires connecting two output terminals to either side of the capacitor, so that the logarithmic output voltage appears across these two terminals.

Figure 3:
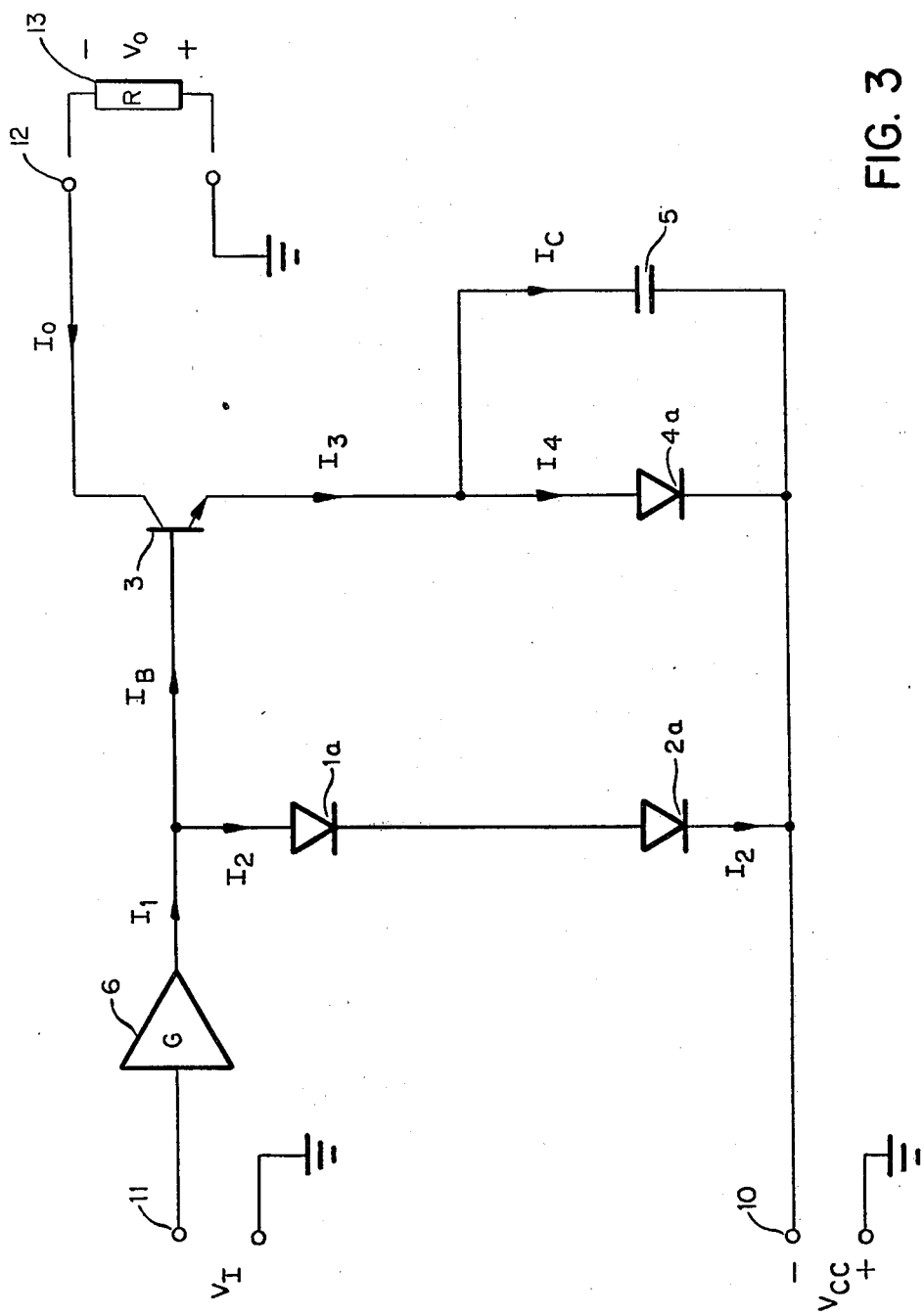
FIG. 3 is a schematic diagram of a variation of the basic circuit in which transistors 1, 2 and 4 are replaced by diodes.
Figure 4:
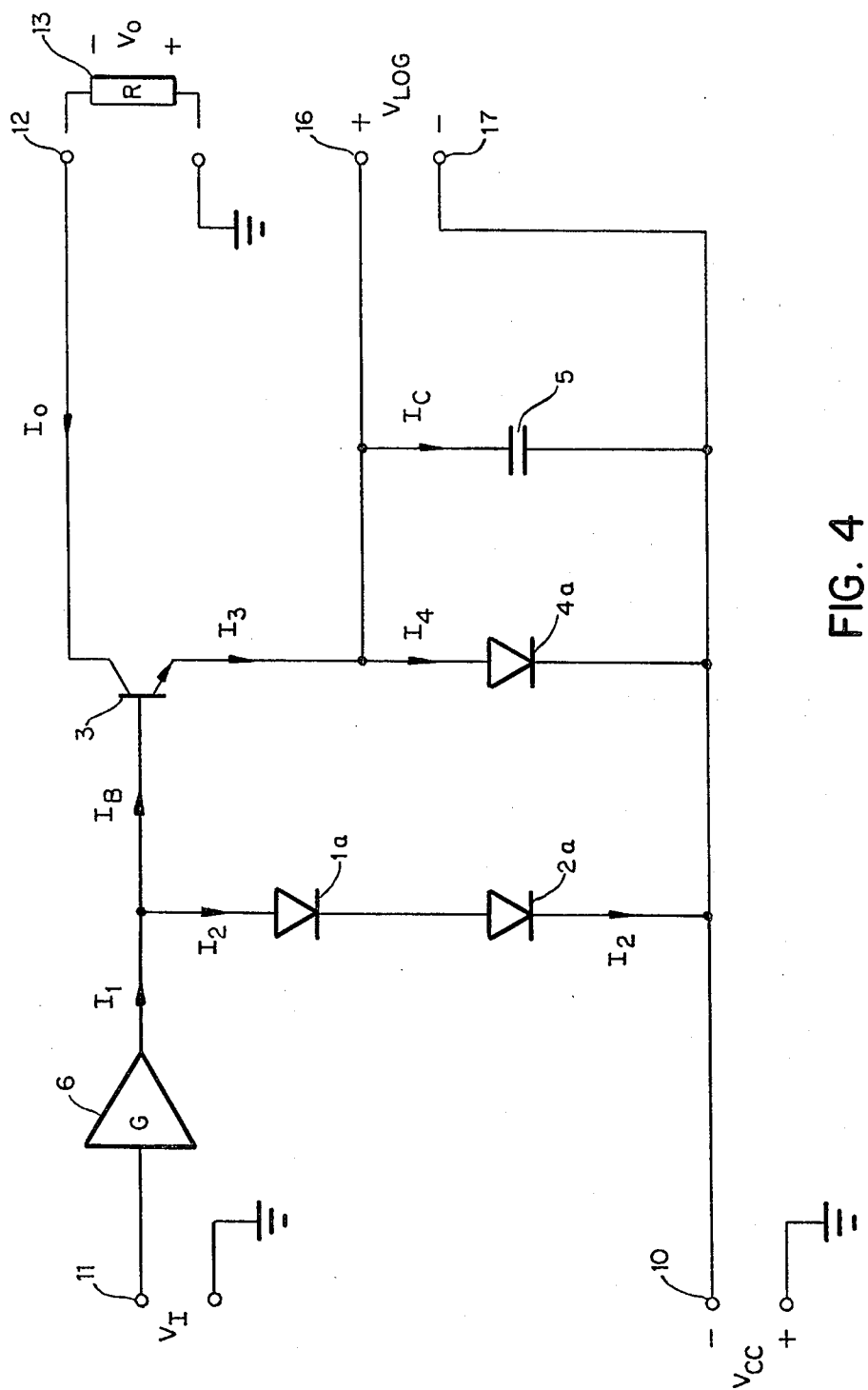
FIG. 4 is a schematic diagram of an improved RMS circuit which has a logarithmic output.

For example, FIG. 4 shows the circuit obtained by adding this modification to the circuit shown in FIG. 3. The logarithmic output voltage $V_{LOG}$ appears across terminals 16 and 17.

Figure 5:
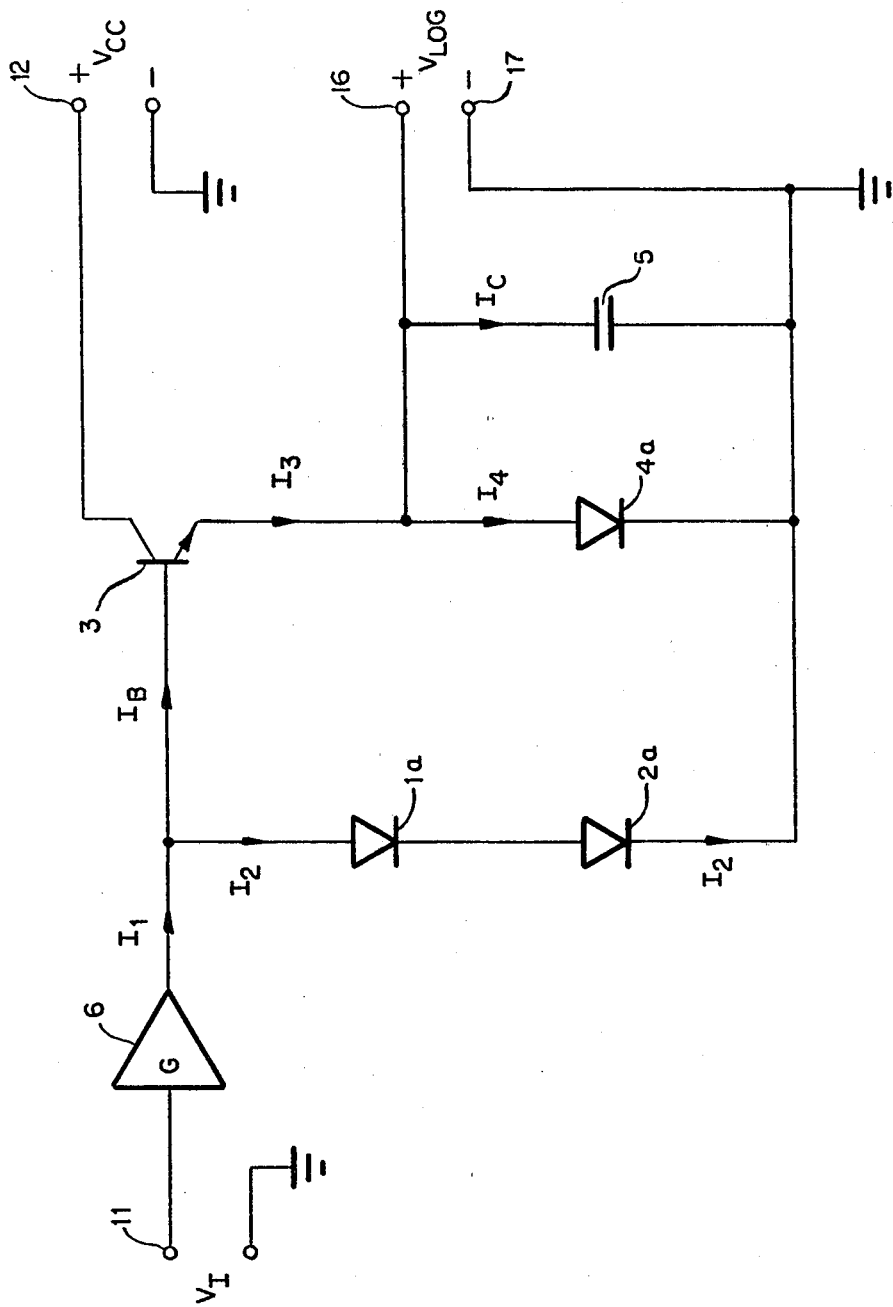
FIG. 5 is a schematic diagram of a variation of the embodiment of FIG. 4 in which the ground reference point is moved.

If $I_o$ and $V_o$ are not desired to be used, terminal 12 may be grounded, or else transistor 3's collector may be grounded directly and terminal 12 omitted. A further possible modification, as shown in FIG. 5, would be to redefine the ground reference point by substituting a ground connection for terminal 10 and connecting voltage source $V_{cc}$ to terminal 12. This has the advantage of placing output terminal 17 at ground potential.

Figure 8:
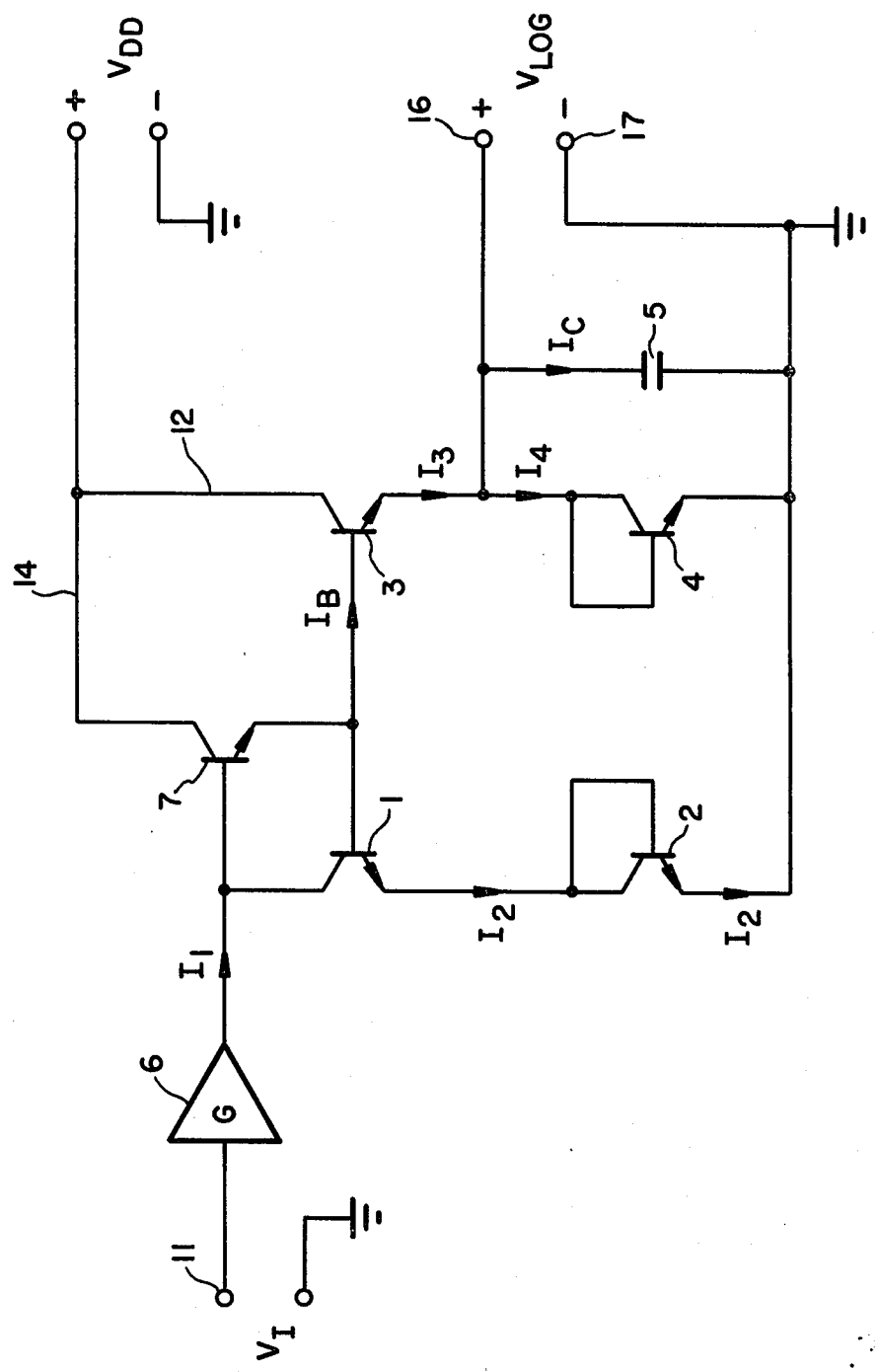
FIG. 8 is a schematic diagram of an embodiment which combines some of the features shown in FIGS. 2 and 5.

The circuits shown in FIGS. 1 and 2 can be modified similarly. If the circuit shown in FIG. 2 is modified in this manner, it is unnecessary for voltage sources $V_{cc}$ and $V_{DD}$ to be distinct. Terminals 12 and 14 may both connect to a single positive voltage source, as shown in FIG. 8.

Figure 6:
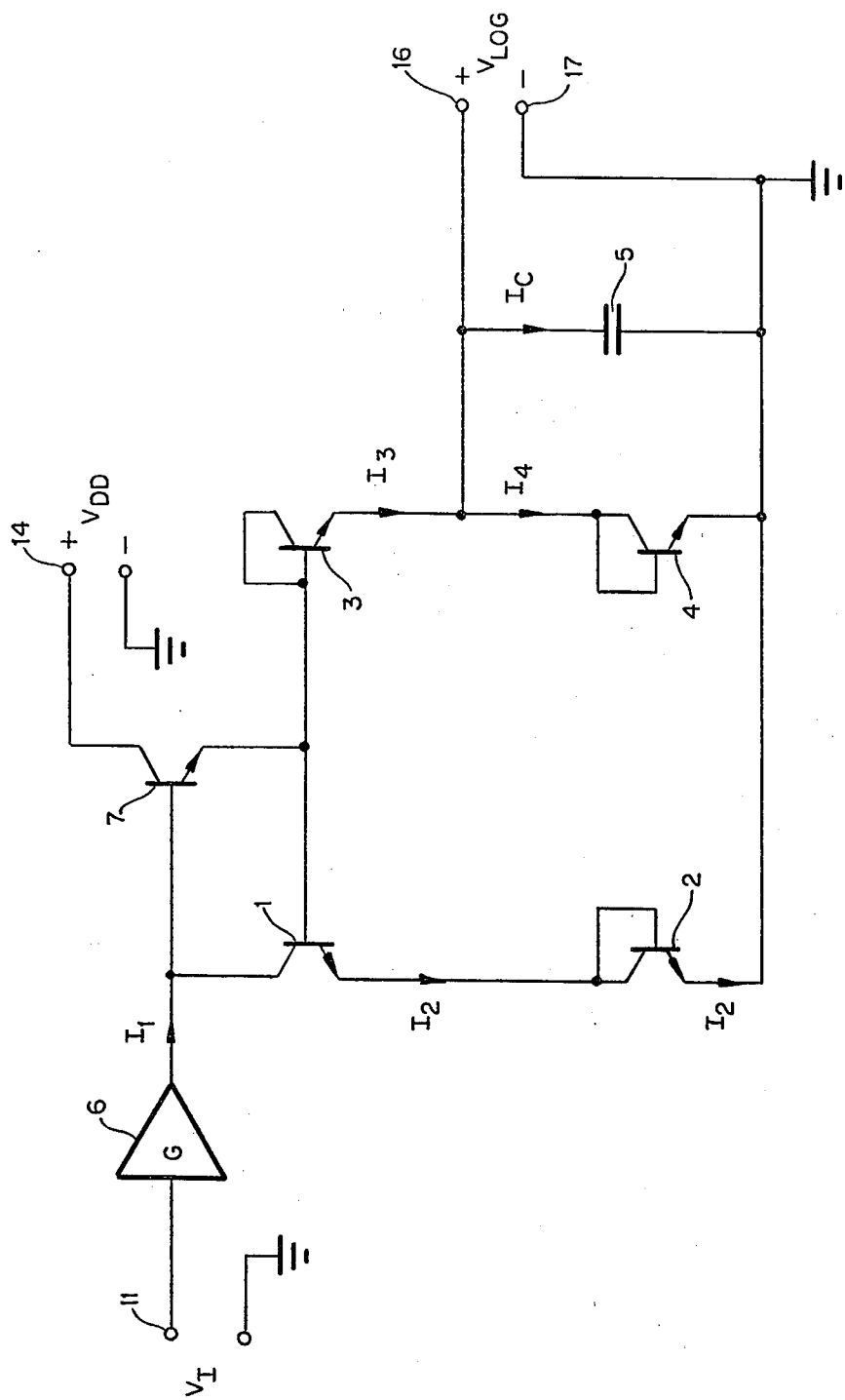
FIG. 6 is a schematic diagram of an embodiment which combines some of the features shown in FIGS. 2 and 5.

If $I_o$ and $V_o$ are not desired to be used, an alternative to grounding transistor 3's collector is to connect it to transistor 3's base. This will not work in the circuits of FIG. 1, 3, 4 or 5 because transistor 3 is required to prevent $I_3$ from reducing $I_2$. However, it will work in the circuit of FIG. 2 because transistor 7 therein prevents $I_3$ from reducing $I_2$. FIG. 6 shows a modification of the circuit of FIG. 2 in which the collector and base of transistor 3 are connected together, and in which the ground reference point is moved to terminal 17 in the manner already discussed in connection with FIG. 5.

Figure 7:
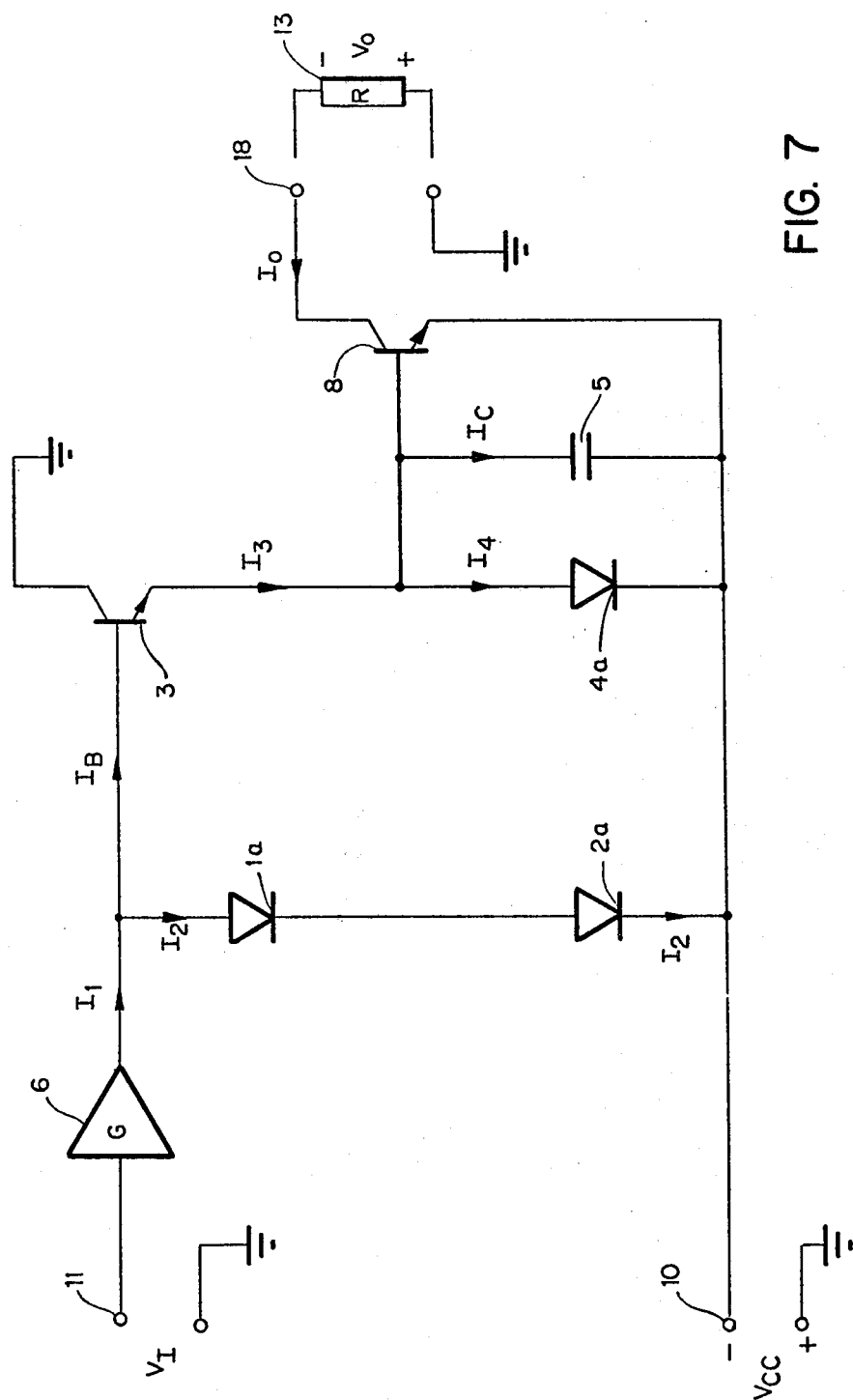
FIG. 7 is a schematic diagram of an improved RMS circuit having a linear output which needs no additional averaging.

According to the present invention, these circuits with logarithmic output voltages can be converted to circuits with linear output currents by adding another transistor 8 whose base and emitter connect to terminals 16 and 17 across which appears the logarithmic output voltage, and whose collector connects to an output terminal 18 through which flows the output current $I_o$. FIG. 7 illustrates the circuit obtained by applying these modifications to the circuit of FIG. 4.

The type of circuit just described has one important advantage over those shown in FIGS. 1 through 3. This type has an output current which already has been averaged by capacitor 5, and is therefore directly proportional to the RMS value of the input signal without requiring any additional averaging. This type of circuit is useful in applications in which the output current is connected to a display device which does not inherently perform the averaging function. (See the discussion following equation (14), above.)

Another feature of the present invention is that it can be implemented so that, in addition to measuring RMS values, it operates as a squaring circuit. Each of the circuits shown in FIGS. 1, 2 and 3 has this feature; i.e., each has a time-varying output signal $I_o$ or $V_o$ proportional to the square of the value of the input signal $V_I$. This squaring operation may be verified by applying to eqn. (5a) the fact, from eqn. (8), that $I_4$ is essentially constant. This yields the result that $I_3$ is proportional to $I_2$ squared. Applying eqns. (10) and (12) to this result yields the stated relationship that $I_o$ and $V_o$ are proportional to $V_I$ squared.

If the input signal is a sine wave, each of these circuits also acts as a frequency doubler, because squaring a sine wave produces a signal whose AC component is a sine wave at twice the frequency of the original sine wave.

I claim:

1. An electrical circuit which provides a unidirectional output current whose average value is proportional to the root-mean-square (RMS) value of a time-varying input signal, comprising
   an output terminal out of which flows the output current;
   a common node;
   a rectifying circuit, adapted for receiving the input signal, which includes a current node and which produces a unidirectional current flowing out of the current node whose value is proportional to the absolute value of the input signal;

a voltage source terminal, adapted for connection to a voltage source;

a first transistor whose collector connects to the voltage source terminal and whose base connects to the current node;

a second transistor whose collector connects to the current node and whose base connects to the emitter of the first transistor;

a first semiconductor rectifier connected between the emitter of the second transistor and the common node;

a third transistor whose collector connects to the output terminal and whose base connects to the base of the second transistor;

a second semiconductor rectifier connected between the emitter of the third transistor and the common node; and a capacitor connected to, and in parallel with, the second semiconductor rectifier.

2. An electrical circuit which provides an output voltage proportional to the logarithm of a quantity proportional to the root-mean-square (RMS) value of a time-varying input signal, comprising a first output terminal and a second output terminal, across which appears the output voltage;

a voltage source terminal, adapted for connection to a voltage source;

a rectifying circuit, adapted for receiving the input signal, which includes a current node and which produces a unidirectional current flowing out of the current node whose value is proportional to the absolute value of the input signal;

two semiconductor rectifiers connected in a series circuit, this series circuit being connected between the current node of the rectifying means and the first output terminal;

a transistor whose collector connects to the voltage source terminal, whose base connects to the current node of the rectifying means, and whose emitter connects to the second output terminal;

a third semiconductor rectifier connected between the first output terminal and the second output terminal; and a capacitor connected between the first output terminal and the second output terminal.

3. An electrical circuit which provides an output voltage proportional to the logarithm of a quantity proportional to the root-mean-square (RMS) value of a time-varying input signal, comprising a voltage source terminal, adapted for connection to a voltage source;

a rectifying circuit, adapted for receiving the input signal, which includes a current node and which produces a unidirectional current flowing out of the current node whose value is proportional to the absolute value of the input signal;

a first transistor whose collector connects to the voltage source terminal and whose base connects to the current node of the rectifying circuit;

a second transistor whose collector and base connect to the base and emitter, respectively, of the first transistor;

a common node;

a first semiconductor rectifier connected between the emitter of the second transistor and the common node;

a first output terminal and a second output terminal, across which appears the output voltage, the second output terminal being connected to either the common node or the emitter of the first transistor;

a capacitor connected between the first output terminal and the second output terminal;

a second semiconductor rectifier connected between the first output terminal and the common node; and a third semiconductor rectifier connected between the emitter of the first transistor and the first output terminal.

4. An electrical circuit which provides an output voltage proportional to the logarithm of a quantity proportional to the root-mean-square (RMS) value of a time-varying input signal, comprising a voltage source terminal, adapted for connection to a voltage source;

a rectifying circuit, adapted for receiving the input signal, which includes a current node and which produces a unidirectional current flowing out of the current node whose value is proportional to the absolute value of the input signal;

a first transistor whose collector connects to the voltage source terminal and whose base connects to the current node of the rectifying circuit;

a second transistor whose collector and base connect to the base and emitter, respectively, of the first transistor;

a first output terminal and a second output terminal, across which appears the output voltage;

a capacitor connected between the first output terminal and the second output terminal;

a first semiconductor rectifier connected between the emitter of the second transistor and the second output terminal;

a second semiconductor rectifier connected between the first output terminal and the second output terminal; and a third transistor whose collector connects to the voltage source terminal, whose base connects to the emitter of the first transistor, and whose emitter connects to the first output terminal.

5. An electrical circuit according to claim 1, 2, 3 or 4, wherein each semiconductor rectifier is oriented so as to be forward-biased by the unidirectional current produced by the rectifying circuit, and the conductivity type of each transistor is such that the transistor's emitter-base junction is forward-biased by the unidirectional current produced by the rectifying means.

6. An electrical circuit according to claim 5, wherein each semiconductor rectifier is a semiconductor diode.

7. An electrical circuit according to claim 5, wherein each semiconductor rectifier is a transistor whose base and collector are connected together, and whose emitter and collector terminals are connected to the electrical circuit as the two terminals of a semiconductor rectifier.

8. An electrical circuit according to claim 2, 3 or 4, further comprising:

a third output terminal, out of which flows an output current; and a transistor whose collector connects to the third output terminal, whose base connects to one of the first and second output terminals, and whose emitter connects to the other of the first and second output terminals;

whereby the output current is proportional to the root-mean-square (RMS) value of the input signal.

9. An electrical circuit according to claim 8, wherein each semiconductor rectifier is oriented so as to be forward-biased by the unidirectional current produced by the rectifying circuit, and the conductivity type of each transistor is such that the transistor's emitter-base junction is forward-biased by the unidirectional current produced by the rectifying means.

10. An electrical circuit according to claim 9, wherein each semiconductor rectifier is a semiconductor diode.

11. An electrical circuit according to claim 9, wherein each semiconductor rectifier is a transistor whose base and collector are connected together, and whose emitter and collector terminals are connected to the electrical circuit as the two terminals of a semiconductor rectifier.

12. An electrical circuit which provides a unidirectional output current whose average value is proportional to the root-mean-square (RMS) value of a time-varying input signal, comprising an output terminal out of which flows the output current;

a common node;

a rectifying circuit, adapted for receiving the input signal, which includes a current node and which produces a unidirectional current flowing out of the current node whose value is proportional to the absolute value of the input signal;

a voltage source terminal, adapted for connection to a voltage source;

transistor means having first and second main path terminals and a control terminal, wherein the first main path terminal connects to the voltage source terminal and the control terminal connects to the current node;

a first transistor whose collector connects to the current node and whose base connects to the second main path terminal of the transistor means;

a first semiconductor rectifier connected between the emitter of the first transistor and the common node;

a second transistor whose collector connects to the output terminal and whose base connects to the base of the first transistor;

a second semiconductor rectifier connected between the emitter of the second transistor and the common node; and a capacitor connected to, and in parallel with, the second semiconductor rectifier.

13. An electrical circuit which provides an output voltage proportional to the logarithm of a quantity proportional to the root-mean-square (RMS) value of a time-varying input signal, comprising a voltage source terminal, adapted for connection to a voltage source;

a rectifying circuit, adapted for receiving the input signal, which includes a current node and which produces a unidirectional current flowing out of the current node whose value is proportional to the absolute value of the input signal;

transistor means having first and second main path terminals and a control terminal, wherein the first main path terminal connects to the voltage source terminal and the control terminal connects to the current node of the rectifying circuit;

a transistor whose collector and base connect to the control terminal and second main path terminal, respectively, of the transistor means;

a common node;

a first semiconductor rectifier connected between the emitter of the transistor and the common node;

a first output terminal and a second output terminal, across which appears the output voltage, the second output terminal being connected to either the common node or the second main path terminal of the transistor means;

a capacitor connected between the first output terminal and the second output terminal;

a second semiconductor rectifier connected between the first output terminal and the common node; and a third semiconductor rectifier connected between the second main path terminal of the transistor means and the first output terminal.

* * * * *